United States Patent
Tran

[19]

[11] Patent Number: 6,005,793
[45] Date of Patent: Dec. 21, 1999

[54] MULTIPLE-BIT RANDOM-ACCESS MEMORY ARRAY

[76] Inventor: Thang Minh Tran, 5209 Eagle Trace Trail, Austin, Tex. 78730

[21] Appl. No.: 09/052,518

[22] Filed: Mar. 31, 1998

[51] Int. Cl.[6] .............................. G11C 11/00; G11C 16/04
[52] U.S. Cl. ....................................... 365/154; 365/185.01
[58] Field of Search .............................. 365/185.01, 203, 365/210, 233, 244, 154

[56] References Cited

U.S. PATENT DOCUMENTS 4,804,871   2/1989   Walters, Jr. .
5,619,464   4/1997   Tran .

OTHER PUBLICATIONS

Ashish Karandikar and Keshab K. Parhj, "Low Power SRAM Design Using Hierarchical Divided Bit–Line Approach", ICCD '98, pp. 82–82, Oct. 1998.

*Primary Examiner*—David Nelms
*Assistant Examiner*—Anh Phung

[57] ABSTRACT

A cache memory consists of plurality of memory bits within a random-access memory (RAM) cell. An extra address decode circuit is needed to select a single memory bit within the multi-bit RAM cell before normal access of RAM array circuit. Combining of multiple bits into a RAM cell reduces the number of interconnections in comparison to single bit RAM cell. This technique eliminates the need to break up the cache array into multiple sets for reducing power dissipation. The area advantages are also from optimal layout of multi-bit RAM cell, address decoder, and sense amplifier unit. Furthermore, the interconnections can be widened to reduce the RC delay as it is a dominating factor in future technology advancement. The multiplexing of the bits are done before the row decoding thus reducing one level of multiplexing after reading of data from the sense amplifier units.

17 Claims, 4 Drawing Sheets

MULTIPLE-BIT RANDOM-ACCESS MEMORY ARRAY

BACKGROUND OF THE INVENTION

1. Field of the Invention

This invention relates to random access memory arrays and more particularly to a high performance static multi-bit random access memory arrays.

2. Brief Description of the Related Technology

Random access memory (RAM) arrays are employed within a variety of digital systems to provide data storage. A static RAM stores bits in an array of flip-flops, whereas a dynamic RAM stores bits as charged capacitors. A bit once written in a static RAM stays there until rewritten, unless the power is turned off. In a dynamic RAM, the data will disappear due to discharge, unless "refresh".

A typical static RAM circuit includes an array of RAM cells in a predetermined arrangement of columns and rows. Upon each cycle a row is enabled to allow the reading of a selected cell through a differential sense amplifier. RAM arrays have been used extensively as cache in high performance microprocessors. Caches are small and fast memories that are either included on the same monolithic chip with the microprocessor core, or are coupled nearby. With advancement in technology, the cache size increases 50 to 100 folds over the last 10 years. RAM arrays take a large area and become major contributor to power dissipation.

To reduce the power dissipation, the cache array is divided into sets with a single set enabled per access. A subset of index bits from the requested address is used to select and enabled only a single set. Each set of the cache array has its own address decoders, input buffers, sense amplifiers, and routing buses. This organization of cache array trades area for power dissipation. Furthermore, the routing of the buses from multiple sets of cache array introduces extra delay in cache access time.

In addition, the transistor's size and delay scales better with technology in comparison to interconnect, metal routing. The shrinking geometry of transistor's size makes it difficult to efficiently lay out the random-access memory (RAM) cell and associated address decoder cell and sense amplifier without violating design rules. In term of interconnect, each RAM cell required a total of five metal lines; one row line, two bit lines, and two power lines. Only the power lines can be shared with the neighbor cells. The RAM cells is dominated by interconnects and the speed is limited by the resistance-capacitance delay of the interconnects.

SUMMARY OF THE INVENTION

The problems outlined above are in large part solved by a multi-bit random-access memory (RAM) cell in accordance with the present invention. The multi-bit RAM cell comprises plurality of bit cells and plurality of bit select lines in addition to the row line and two bit lines as in prior-art RAM cells. A subset of index bits is used for bit select lines to select a single bit from the multi-bit RAM cell. Multiplexing of the bit cells is accomplished during the precharge phase prior to accessing of the array. The cache array employing the multi-bit RAM cells has many advantages such as efficiency, area, power dissipation, and access time over the cache array with prior-art RAM cell.

First of all, for N bits, the prior-art RAM cells required N row lines and 2*N bit lines while the N-bit RAM cell required 1 row line, 2 bit lines, and N bit select lines. For example, the number of interconnects for 4-bit RAM cell is 7 lines in comparison to 12 lines for four prior-art RAM cells. The interconnects of multi-bit RAM cell can use three different metal layers while the interconnects of prior-art RAM cell is limited to two metal layers. The multi-bit RAM cell is not dominated by interconnect, thus allow better optimization in laying out of the RAM cell and associated address decoder cell and sense amplifier. Thus the overall size of the cache array is smaller with multi-bit RAM cell. Furthermore, the interconnect lines can be widen to reduce the resistance-capacitance (RC) delay.

Besides the addition of the multi-bit decode circuit, the multi-bit RAM cells are organized as in normal RAM array implementation with RAM cell columns, address decode circuits, precharge circuits, sense-amplifier circuits, and write circuits. Accessing of the multi-bit RAM cell is similar to that of the normal RAM cell with the exception of selecting the single bit cell. Selecting of a single bit from the multi-bit RAM cell is done by the multi-bit decode circuit during precharge phase which is transparent to the normal access of the RAM cell. One level of multiplexing of output data after the sense amplifier is eliminated, thus the multi-bit RAM array improves the overall access time.

In comparison to the multi-set cache array where the address decoders, sense amplifiers, precharge circuits, input buffers, and routing buses are duplicated, the multi-bit RAM cache array can be efficiently implemented as a single set. The cache array with multi-bit RAM cell dissipates about the same power as one set of the multi-set cache array. The duplicated extra area per set of the multi-set cache array for address decoders, sense amplifiers, precharge circuits, input buffers, and routing buses is significant. In addition, since all the interconnects is localized in a single set, the routing delay is minimized.

A further understanding of the nature and advantages of the present invention may be realized by reference to the remaining portions of the specification and the drawings.

BRIEF DESCRIPTION OF THE DRAWINGS

So that the manner in which the above recited advantages and features of the present invention, as well as others which will become apparent, are attained and can be understood in detail, a more particular description of the invention summarized above may be had by reference to the embodiment thereof which is illustrated in the appended drawings, which drawings form a part of this specification.

It is to be noted, however, that the appended drawings illustrate only typical embodiments of the invention and therefore not to be considered limiting of its scope, for the invention may admit to other equally effective embodiments.

Figure 1:
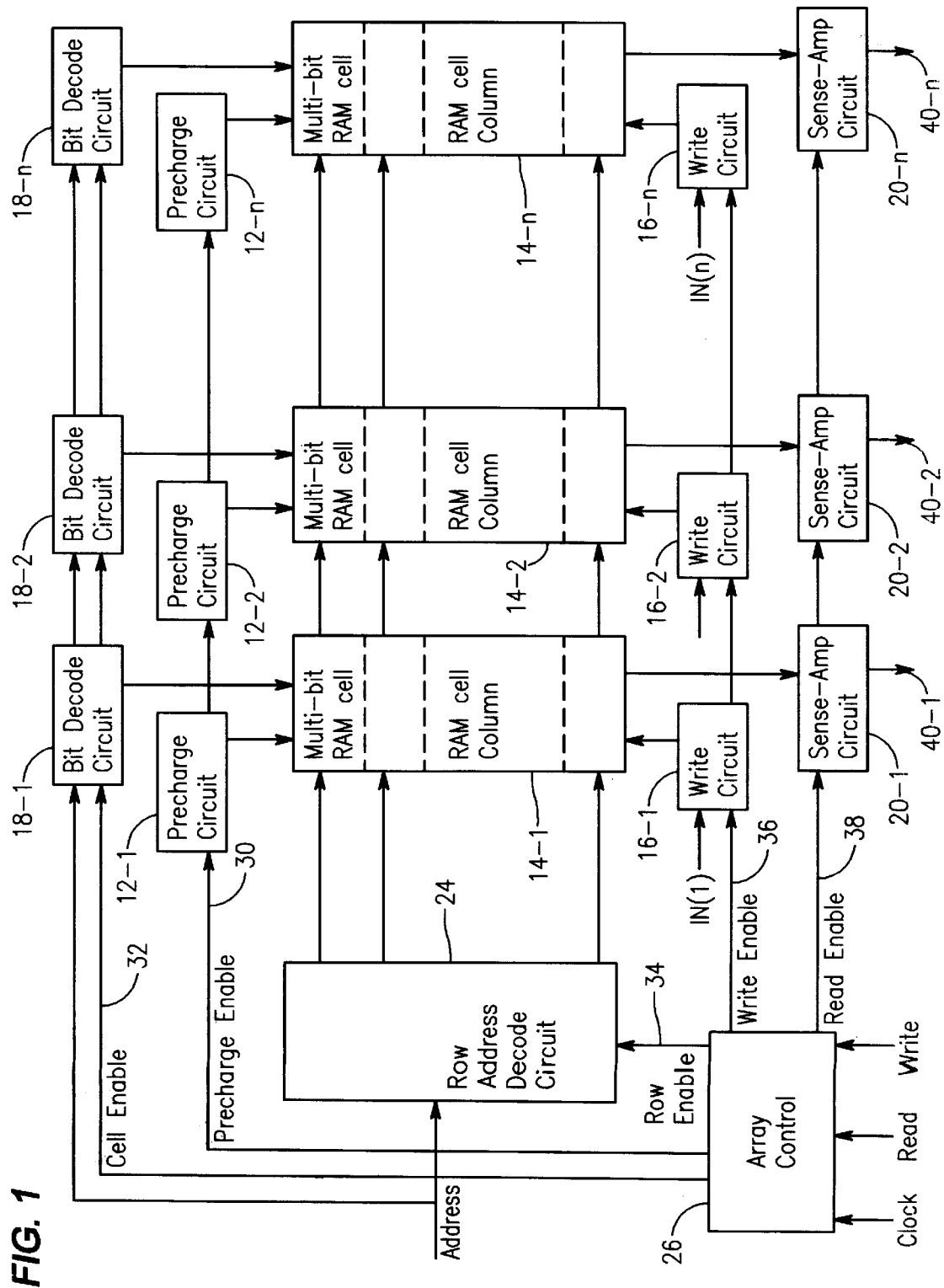
FIG. 1 is a block diagram of a random access memory array circuit including the multi-bit RAM cell in accordance with one embodiment of the present invention.

While the invention is susceptible to various modifications and alternative forms, specific embodiments thereof are shown by way of example in the drawing and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Referring now to the drawings, FIG. 1 is a block diagram of a RAM array circuit in accordance with one embodiment of the present invention. The RAM array circuit includes a plurality of RAM cell columns 14-1 through 14-n coupled to precharge circuits 12-1 through 12-n, to bit decode circuits 18-1 through 18-n, to write circuits 16-1 through 16-n, and to sense amplifier circuits 20-1 through 20-n. RAM cell columns 14-1 through 14-n are referred collectively as RAM cell columns 14, precharge circuits 12-1 through 12-n are referred collectively as precharge circuits 12, bit decode circuits 18-1 through 18-n are referred collectively as bit decode circuits 18, write circuits 16-1 through 16-n are referred collectively as write circuits 16, and sense amplifier circuits 20-1 through 20-n are referred collectively as sense amplifier circuits 20. Each RAM cell column includes a plurality of individual multi-bit RAM cells, each configured to store multi-bit of data. A row address decode circuit 24 is shown coupled to RAM cell columns 14. An array control 26 is finally shown coupled to precharge circuits 12, bit decode circuits 18, row address decode circuit 24, write circuits 16, and sense amplifier circuits 20.

The array control 26 received input clock, read, and write signals to control the operation of the RAM array circuit, namely the precharge and access of the RAM array. The clock period is divided into two phases, the precharge phase and the access phase. The precharge circuits 12 are provided to precharge the respective RAM cell columns 14 in response to precharge phase of the clock period. The precharge timing, controlled by precharge enable signal 30 from the array control 26, should have sufficient time for charging all the bit lines of the RAM cell column 14 to a high voltage. The row address decode circuit 24 is enabled by row enable signal 34 to begin the access phase as the precharge circuits 12 are disabled. For write access, the write circuits 16 are then enabled by the write enable signal 36 for writing respective RAM cell columns 14. For read access, the sense amplifier circuits 20 are enable by the read enable signal 38 for outputting data on signals 40-1 through 40-n. The read enable signal 38 is enabled after a certain delay (in array control 26) from the row enable signal 34 to allow the bit lines of RAM cell columns 14 to have a differential voltage. The sense amplifier circuits 20 use this differential voltage to provide output data. Furthermore, the read enable signal 38 isolates the RAM cell columns 14 from the sense amplifier circuits 20 to reduce the capacitance loading seen by the sense amplifier circuits 20. The write enable signal 36 and read enable signal 38 is originated from input read and write signals of array control 26. After successful reading or writing of the RAM cell columns 14, the row enable signal 34, write enable signal 36, and read enable signal 38 are deasserted where a new cycle of the RAM array circuit can start. The above description of the precharging and accessing the RAM array is a typical prior art implementation. It is noted that the enable signals 30, 32, 34, 36, and 38 can be triggered by the input clock signal in array control 26.

The present invention includes the bit decode circuits 18 to select a single bit cell of the multi-bit RAM cell of the respective RAM cell columns 14. During the inactive phase of the row address decode circuits 24, the multi-bit RAM cells are isolated, at which time, the single bit cell of the multi-bit RAM cell are selected. During the active phase of the row address decode circuits 24, the selected bit cell of the multi-bit RAM cell is accessed.

The order of enabled signals for writing of data within a clock cycle from the array control circuit 26 is as followed:

1. Precharge enable signal 30 is enabled for the precharge circuits 12 to precharge the bit lines of the RAM cell columns 14 to a high voltage.
2. Cell enable signal 32 is enabled for the bit decode circuits 18 to select a bit cell of the multi-bit RAM cell of RAM cell columns 14.
3. Precharge enable signal 30 is disabled.
4. Row enable signal 34 is enabled for the row address decode circuit 24 to select a row of multi-bit RAM cells of the RAM cell columns 14.
5. Write enable signal 36 is enabled for the write circuits 16 to write data IN(1) through IN(n) into the selected bit cells. The write input signal to array control circuit 26 causes the write enable signal 36 to be asserted.
6. Row enable signal 34 and write enable signal 36 are disabled.
7. Repeat the cycle again.

The order of enabled signals for reading of data within a clock cycle from the array control circuit 26 is as followed:

1. Precharge enable signal 30 is enabled for the precharge circuits 12 to precharge the bit lines of the RAM cell columns 14 to a high voltage.
2. Cell enable signal 32 is enabled for the bit decode circuits 18 to select a bit cell of the multi-bit RAM cell of RAM cell columns 14.
3. Precharge enable signal 30 is disabled.
4. Row enable signal 34 is enabled for the row address decode circuit 24 to select a row of multi-bit RAM cells of the RAM cell columns 14.
5. Read enable signal 38 is enabled for the sense amplifier circuits 20 to read data from the RAM cell columns 14. The read input signal to array control circuit 26 causes the read enable signal 38 to be asserted.
6. Row enable signal 34 is disabled.
7. The precharge enable signal 30 can be enabled before the read enable signal 38 is disabled to repeat the cycle again.

Figure 2:
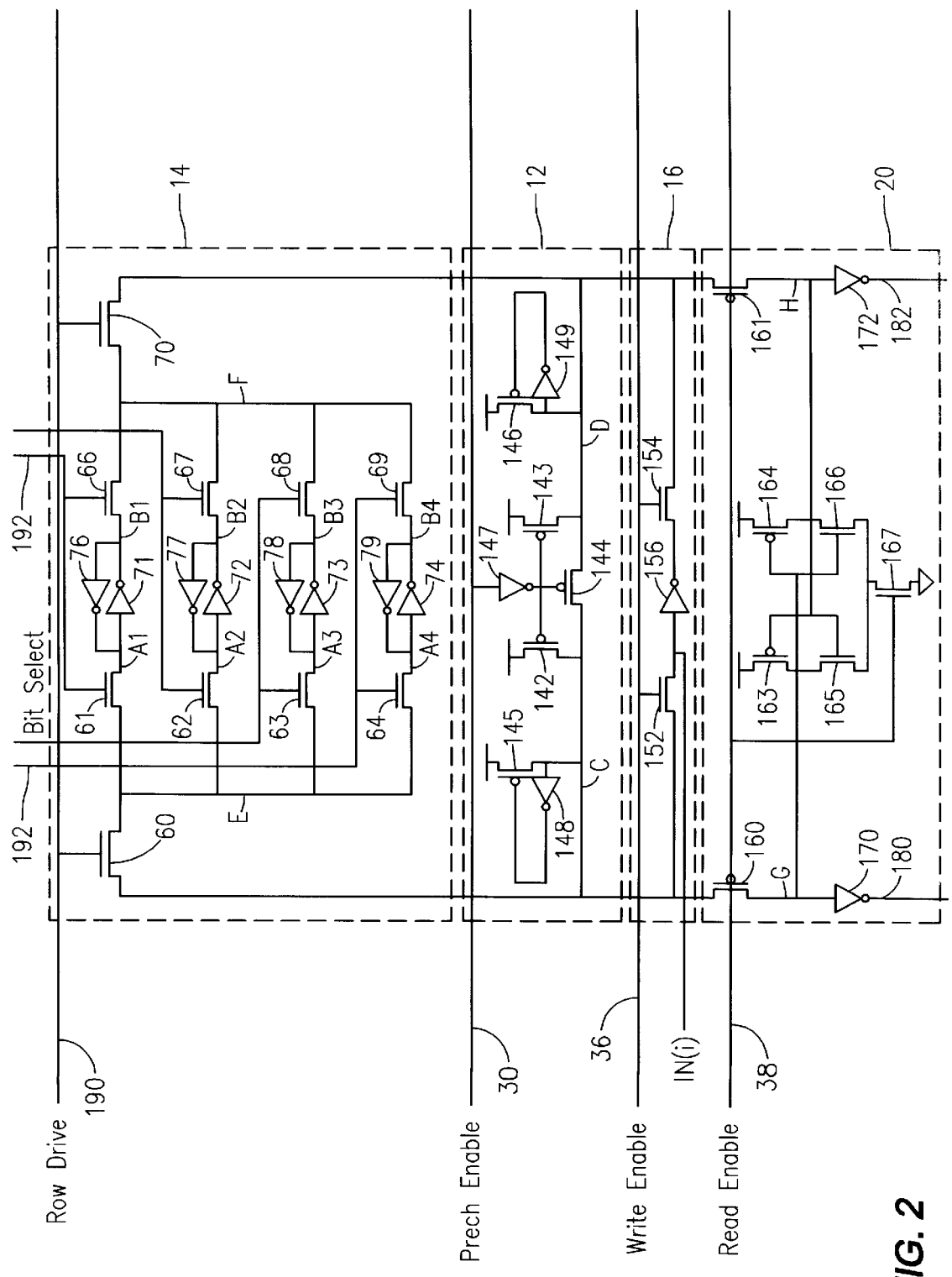
FIG. 2 is a schematic diagram that illustrates a circuit implementation of a 4-bit RAM cell array circuit in accordance with the present invention.

Turning next to FIG. 2, a schematic diagram is shown of portions of one implementation of the RAM array circuit of FIG. 1. Circuit portions that correspond to the RAM column of FIG. 1 are numbered identically for simplicity and clarity.

FIG. 2 illustrates an exemplary diagram RAM column 14 including a plurality of multi-bit RAM cells, a representative one of which includes FETs 60 and 70 and four bit cells, the first bit cell includes FETs 61 and 66, and inverters 71 and 76, the second bit cell includes FETs 62 and 67, and inverters 72 and 77, the third bit cell includes FETs 63 and 68, and inverters 73 and 78, the fourth bit cell includes FETs 64 and 69, and inverters 74 and 79. The first bit cell stores a bit of data at node A1 and its complement at node B1. The second bit cell stores a bit of data at node A2 and its complement at node B2. The third bit cell stores a bit of data at node A3 and its complement at node B3. The fourth bit cell stores a bit of data at node A4 and its complement at node B4 The single bit cell of the multi-bit RAM cell is collectively configured to store a bit of data at node A and its complement at node B. For this example, four bit cells are used for each multi-bit RAM cell but any plurality of bit cells can be used in the present invention. The FETs of the bit cells are coupled to the bit select signals 192 from the bit decode circuits 18 (of FIG. 1) for selecting a bit cell. The FETs 61–64 and 66–69 form multiplex gates with one pair of FETs is selected at all time. Once the bit cell is selected, its data and its complement are reflected on node E and F, respectively. Nodes E and F always have stable voltage during access phase. The FETs 60 and 70 of the multi-bit RAM cell 14 is selected by row drive signal 190 originating from a portion of the address decode circuit 24 (of FIG. 1). The bit cells are isolated from the bit lines C and D when the row drive signal 190 is deasserted. The bit cells is multiplexing during the inactive phase of row drive signal 190. Multiplexing of bit cells prior to accessing the array eliminates one level of multiplexing of data after the sense amplifier circuits 20 thus the access time of the RAM array circuit is reduced. It is noted that a plurality of additional multi-bit RAM cells are coupled in parallel with the illustrated multi-bit RAM cell within the RAM column, and that each cell within a given column may be selected with a separate select signal from address decode circuits 24.

The bit select lines 192 are selected before the row drive signal 190 is enabled so that nodes E and F are at stable voltage. Since the row drive signal 190 is disabled during precharge, the bit select lines 192 can change during the precharge phase. The bit select lines 192 are designed to be non-overlapping so that only one pair of FETs to the selected bit cell are enabled at a time. The data from one bit cell can corrupt the data of another bit cell if both pairs of FETs are enabled at the same time. In special application such as setting of clearing the array, all bit select lines 192 can be enabled at the same time for writing of input data into the multi-bit RAM columns 14.

The prior art implementation of a RAM cell contents a single bit cell of two inverters and two FETs. For older technology, the transistors dominate the layout of the RAM cell. As technology advances, the metal routing does not scale as well as the transistor in term of physical size and timing delay, the layout is currently dominated by the metal routing. More metal routing layers are added with new process technology without much usage by the prior art RAM cell since only two metal layers are needed for bit and row lines. Furthermore, a row address decoder cell is needed per row of RAM cells and a sense amplifier circuit is needed per column of RAM cells, they require more and much larger transistors. In order to abide by the dimensions of the RAM cells, the row address decoder and sense amplifier circuits become very long with inefficient layout. In order to implement four RAM bit cells of prior art, the number of required routing metals is four row lines, eight bit lines, and four power lines (share with adjacent cells). The four-bit RAM cells accordance to the present invention need one row line, two bit lines, four bit select lines, and one power line (share with adjacent cells) which significantly reduce the total number of routing metal lines from the prior art RAM cell implementation. More important, the multi-bit RAM cell can take advantage of technology advancement by using three different metal layers for the row lines, bit lines, and bit select lines. These metal routings can also widen to improve the resistance-capacitance (RC) delay. The layout of the multi-bit RAM cell is no longer restricted by the metal routing thus allowing more efficient layout of multi-bit RAM cells. For the four-bit RAM array circuit of this invention, a single row address decode cell and sense amplifier circuit are needed per four bit cells. The dimensional restriction on the layout of the row address decode and sense amplifier circuits are eased for more efficient layout.

A precharge circuit 12 is coupled to the RAM column 14 for precharging the RAM column 14. Precharge circuit 12 includes FETs 142–146 and inverters 147–149. It is noted that precharge enable line 30 is driven high, through inverter 147, FETs 142–144 turn on and precharge nodes C and D. Inverters 148 and 149, and FETs 145 and 146 operate as weak pull-ups devices to maintain nodes C and D high unless drives low by other elements.

A write enable circuit 16 as well as a sense amplifier circuit 20 are also shown couple to RAM cell column 14. Write enable circuit 16 includes inverter 156 and FETs 152 and 154. The write enable circuit 16 is selected by write enable signal 36 originating from the array control circuit 26. The IN data and its complement through inverter 156 are driven through the FETs 152 and 154 to the RAM column 14 to the bit cell of the multi-bit RAM cell. The write enable signal 36 enabling FETs 152 and 154 causing input data IN to be driven at node C and its complement through inverter 156 to be driven at node D.

FIG. 2 also illustrates a sense amplifier circuit 20 which provides output from RAM column 14. The circuit includes FETs 160–167 and inverters 170 and 172. After the row drive signal 190 is enabled, one of the bit lines C or D is driven low by the selected bit cell within the multi-bit RAM cell. Node G and H are connected to bit lines C and D through FETs 160 and 161, respectively. As the differential voltages of nodes G and H is sufficient for reliably sensing, the read enable signal 38 is enabled to activate the sense amplifier circuit 20 and isolate the RAM column 14. In the array control circuit 26, a delay element is built into the read enable signal 38 to ensure that the differential voltage meet the requirement for reliably reading of data by the sense amplifier circuit 20. When read enable signal 38 is asserted high, sense amplifier 20 turns on and the differential voltage between nodes G and H is detected. A corresponding output signal along with its complement are provided at lines 180 and 182, respectively. As the read enable signal 38 is asserted, FETs 160 and 161 are disabled to isolate the bit lines of RAM column 14 thus reducing the loading capacitance (from the bit lines of RAM column 14) seen by the sense amplifier circuit 20. Furthermore, the row enable signal 34 can be deasserted as read enable signal 38 is asserted and precharge enable signal 30 can start a new cycle.

Figure 3:
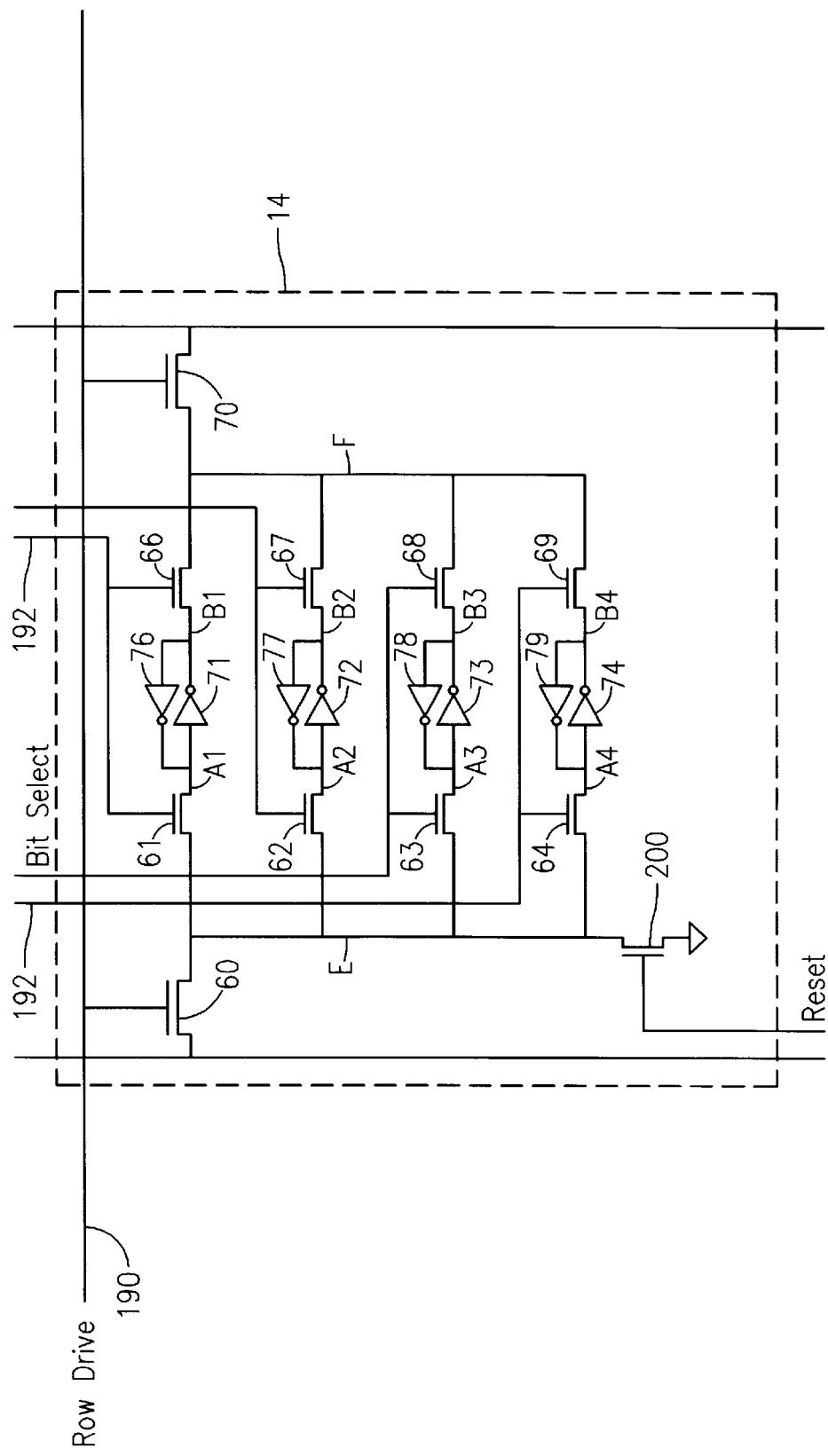
FIG. 3 is a schematic diagram that illustrates a circuit implementation of a 4-bit RAM cell with reset logic.

As with prior-art RAM cell, other variation of the RAM cell can also be applied to the multi-bit RAM cell. For example, the multi-bit RAM cell with reset is shown in FIG. 3. Additional pull-down FET 200 is added to node E of the multi-bit RAM cell. The reset signal can be activated along with all the bit select lines to clear all the bits of the multi-bit RAM cell. The above example is one embodiment of the present invention, other variation of implementation to set or clear all bits of the multi-bit RAM cell are within the scope of this invention.

Figure 4:
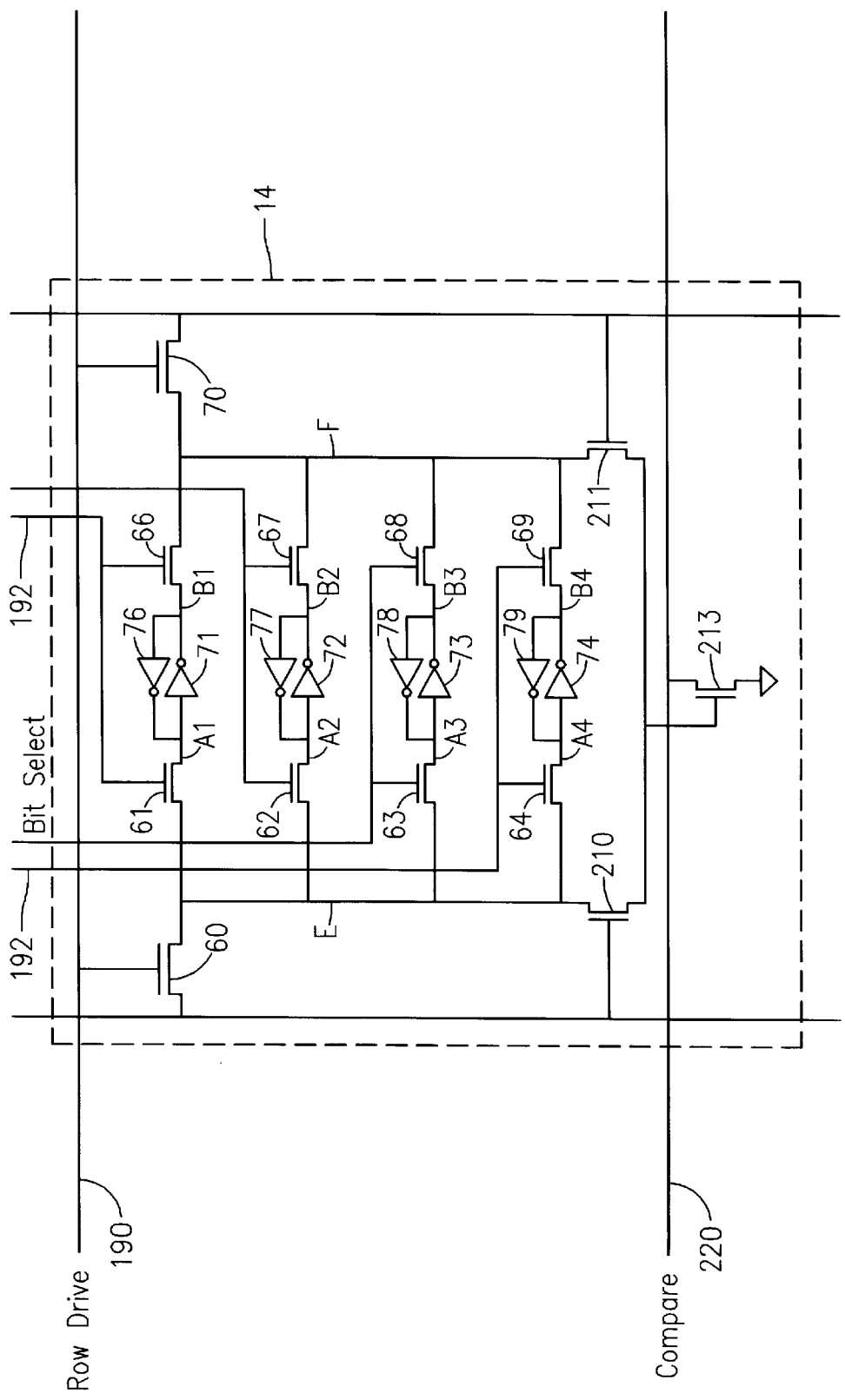
FIG. 4 is a schematic diagram that illustrates a circuit implementation of a 4-bit content addressable memory cell.

Another application of the RAM cell is the content addressable memory cell where the content of the RAM cell is compared to the data driven on the bit lines. One embodiment of the content addressable memory for multi-bit RAM cell is shown in FIG. 4. The data on node E and its complement on node F of selected bit is compared to the data driven on node C and its complement on node D by the use of FETs 210 and 211. If the data is not matched, then compare signal is pulled down to ground by FET 213.

Numerous variations and modifications will become apparent to those skill in the art once the above disclosure is fully appreciated. While the above description contains many specificities, these should not be construed as limitations on the scope of the invention, but rather as an exemplification of preferred embodiments thereof Accordingly, the scope of the invention should be determined not by the embodiment(s) illustrated, but by the appended claims and their legal equivalents.

I claim:

1. A random access memory array circuit comprising:

a RAM cell column including a plurality of multi-bit RAM cells, wherein each said multi-bit RAM cell comprises a plurality of bit cells, wherein each said bit cell is the storage of one bit of data;

two address decode circuits coupled to said RAM cell column, wherein one of said address decode circuits, says first address decode circuit, is configured to receive an address signal, says first address signal, and to select one of said plurality of multi-bit RAM cells of said RAM cell column and the other of said address decode circuits, says second address decode circuit, is configured to receive another address signal, says second address signal, and to select one of said plurality of bit cells of said multi-bit RAM cell; and a means for uniquely accessing said bit cell from accessing said multi-bit RAM cell by intersection of row and column.

2. The random access memory array circuit as recited in claim 1, wherein each said address decode circuit uses different portion of a requested address.

3. The random access memory array circuit as recited in claim 1, wherein outputs of said second address decode circuit change only when outputs of said first address decode circuit are inactive.

4. The random access memory array circuit as recited in claim 1, wherein outputs of said second address decode circuit are non-overlapping, only one ouput is active at a time.

5. The random access memory array circuit as recited in claim 1 further comprising a pre-charged circuit coupled to said RAM cell column, wherein said precharged circuit coupled to plurality of pass transistors, wherein said pre-charged circuit is configured to precharge said plurality of said RAM cells in response to a clock signal.

6. The random access memory array circuit as recited in claim 1 further comprising a sense amplifier circuit coupled to said RAM cell column, wherein said sense amplifier circuit coupled to plurality of pass transistors, wherein said sense amplifier circuit is configured to provide an output signal indicative of a storage state of a selected bit cell, and wherein said sense amplifier circuit is enabled in response to a read signal.

7. The random access memory array circuit as recited in claim 1 further comprising a write control circuit coupled to said RAM cell column, wherein said write control circuit coupled to plurality of pass transistors, wherein said write control circuit is configured to invoke a storage of data into a selected bit cell or plurality of bit cells of said multi-bit RAM cell, wherein said write control circuit is enabled in response to a write signal.

8. The random access memory array circuit as recited in claim 1 further comprising a write control circuit coupled to said RAM cell column, wherein said write control circuit coupled to plurality of pass transistors, wherein said write control circuit is configured to invoke a storage of set or clear data into a selected bit cell or plurality of bit cells of said multi-bit RAM cell, wherein said write control circuit is enabled in response to a set or clear signal.

9. The random access memory array circuit as recited in claim 1, wherein said RAM cell column comprises plurality of pass transistors coupled to said plurality of multi-bit RAM cells, wherein said plurality of pass transistors are configured to receive outputs of said first address decode circuit, wherein said plurality of pass transistors are configured to select one of said plurality of multi-bit RAM cell based upon said first address signal.

10. The random access memory array circuit as recited in claim 1, wherein said multi-bit RAM cell comprises plurality of pass transistors coupled to said plurality of bit cells, wherein said plurality of pass transistors are configured to receive outputs of said second address decode circuit, wherein said plurality of pass transistors are configured to select one of said plurality of bit cells of the said multi-bit RAM cell based upon said second address signal.

11. The random access memory array circuit as recited in claim 1, wherein said accessing of said RAM cell column is a memory read access.

12. The random access memory array circuit as recited in claim 1, wherein said accessing of said RAM cell column is a memory write access.

13. The random access memory array circuit as recited in claim 1, wherein said accessing of said RAM cell column is a memory set or clear access.

14. The random access memory array circuit as recited in claim 1 further comprising a pull-down device for each said bit cell of said multi-bit RAM cell, wherein said pull-down device is configured to set or clear said bit cell of said multi-bit RAM cell in response to a reset signal.

15. The random access memory array circuit as recited in claim 1 further comprising additional devices for comparing of a selected bit cell of said multi-bit RAM cell to an input data, wherein said additional device is configured to generate a compare signal in response to said input data.

16. A method for accessing a random access memory array comprising:

receiving a requested address;

selecting a memory bit from plurality of memory bits within a memory location based upon decoded first portion of said requested address;

selecting a first subset of said random access memory array based upon decoded second portion of said requested address; and accessing the contents of said random access memory array by decoding of the first and second portions of the requested address.

17. The random access memory array circuit as recited in claim 16, wherein outputs of said decoded first portion of said requested address change only when outputs of said decoded second portion of said requested address are inactive.

* * * * *